US008683411B2

(12) United States Patent
Alpert et al.

(10) Patent No.: US 8,683,411 B2
(45) Date of Patent: Mar. 25, 2014

(54) ELECTRONIC DESIGN AUTOMATION OBJECT PLACEMENT WITH PARTIALLY REGION-CONSTRAINED OBJECTS

(75) Inventors: Charles J. Alpert, Austin, TX (US); John L. McCann, Austin, TX (US); Gi-Joon Nam, Austin, TX (US); Shyam Ramji, Hopewell Junction, NY (US); Taraneh Taghavi, San Diego, CA (US); Natarajan Viswanathan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 12/870,624

(22) Filed: Aug. 27, 2010

(65) Prior Publication Data
US 2012/0054708 A1    Mar. 1, 2012

(51) Int. Cl.
*G06F 17/50*    (2006.01)
(52) U.S. Cl.
USPC ............................ 716/119; 716/104; 716/139
(58) Field of Classification Search
USPC .......................................... 716/104, 119, 139
See application file for complete search history.

(56) References Cited

U.S. PATENT DOCUMENTS

| | | | |
|---|---|---|---|
| 6,446,239 B1 * | 9/2002 | Markosian et al. ........... 716/122 |
| 7,383,527 B2 | 6/2008 | Enomoto et al. |
| 2008/0127017 A1 | 5/2008 | Alpert et al. |
| 2008/0148203 A1 * | 6/2008 | Alpert et al. ...................... 716/6 |
| 2009/0193376 A1 * | 7/2009 | Alpert et al. ...................... 716/9 |
| 2009/0199142 A1 | 8/2009 | Arunachalam et al. |

OTHER PUBLICATIONS

Fruchterman, T.; Graph Drawing by Force-directed Placement; Journal: Softare—Practice and Experience,vol. 21(11); pp. 1129-1164; Date: Nov. 1991; University of Illinois.

* cited by examiner

*Primary Examiner* — Thuan Do
(74) *Attorney, Agent, or Firm* — Libby Toub; Robert C. Rolnik

(57) ABSTRACT

A global placer receives a plurality of regions, each region occupying a sub-area of a design area. receives a plurality of movebound objects, each movebound object associated with a region. The global placer receives a plurality of unconstrained objects, each unconstrained object associated with no region. The global placer receives a tolerance, wherein the placement tolerance defines a coronal fringe to at least one region. The global placer initially placing the plurality of movebound objects and unconstrained objects. The global placer iterates over objects without preference to region-affiliation to select an object, wherein the objects are comprised of the plurality of movebound objects and plurality of unconstrained objects. The global placer determines whether movebound object is within the tolerance of a region associated with the movebound object.

25 Claims, 5 Drawing Sheets

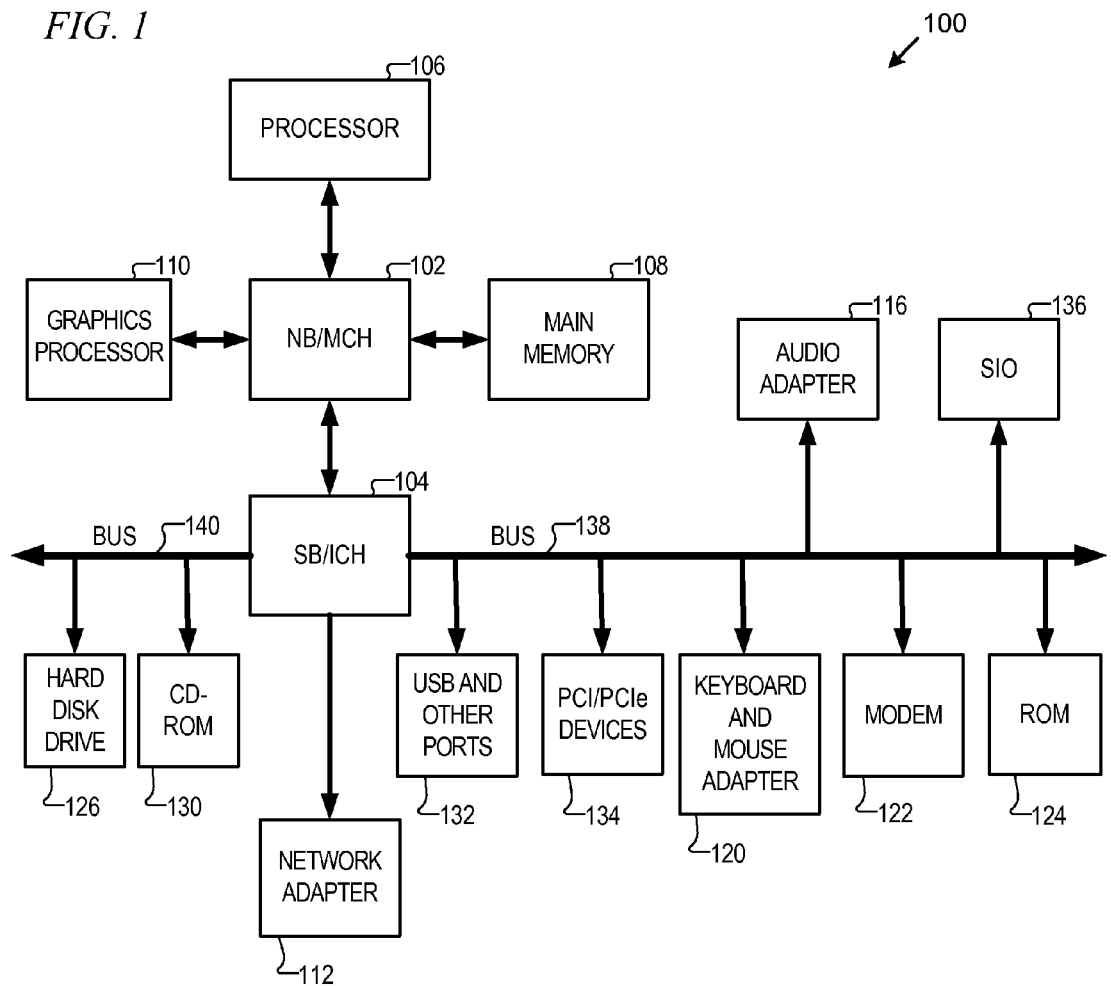

MOVEBOUND OBJECT PLACEMENT TOLERANCE

DEFINE CORONA AS A PROPORTION OF CORRESPONDING REGION

403

TOLERANCE 0%    TOLERANCE 50%

409
CONTINUE

400

ENTER REGION BORDERS

DEFINE REGION CORNERS
 LOWER LEFT:           UPPER RIGHT:
  411                   413
  40, 40                360, 320

REGION NAME:  415   ATTRACTION NET WEIGHT: 416
                      1.5

417
CONTINUE

410

DEFINE MOVEBOUND OBJECTS

IDENTIFY REGION   421

IDENTIFY OBJECT   423

425                427
NEXT OBJECT       CONTINUE

420

ELECTRONIC DESIGN AUTOMATION OBJECT PLACEMENT WITH PARTIALLY REGION-CONSTRAINED OBJECTS

BACKGROUND OF THE INVENTION

1. Field of the Invention

The present invention relates generally to a computer implemented method, data processing system, and computer program product for electronic design automation. More specifically, the present invention relates to placement of electronic objects or cells according to regional constraints.

2. Description of the Related Art

Physical design of integrated circuits has quickly progressed from a uniquely human endeavor to one that is human-directed but, to a large extent, machine-implemented. Design houses rely heavily on automated physical design tools to produce accurate, efficient designs in a small amount of time. Given a netlist description of an integrated circuit, the task of such tools is to place circuit modules on a layout of the integrated circuit and to route interconnections between the modules to achieve a compact layout without violating any design rules, which protect the functional integrity of the integrated circuit. Fully automatic layout systems for custom VLSI integrated circuits are used today. Examples of such systems (followed in parenthesis by the university at which they were developed) are the PI system (Massachusetts Institute of Technology), the Magic system (University of California at Berkeley), the Phoenix system (Stanford) and the Timberwolf system (University of California at Berkeley).

U.S. Pat. No. 5,308,798 (Brasen et al.) describes a circuit laid out as in computer memory having circuit entities interconnected between pins on the circuit entities. A set of pins to be interconnected forms a net and is assigned a weight. The method allows a user to cause the computer program for layout to place a circuit entity (or cell) at a different location on the integrated circuit layout than it would otherwise. Brasen defines a faked two-pin net as one pin being located on the circuit entity and another pin being located in a region of the integrated circuit in which the user desires the circuit to be placed.

The Brasen arrangement applies a bias or a weight to moving a cell or entity to a specific location or coordinate in the die where no existing pin exists to which it is to connect, nor for which a pin is likely to be placed. Moreover, Brasen continues to apply the bias regardless of the position of any intermediate placement of the cell.

Remedies are needed to help with placement and in particular pre-placement.

SUMMARY OF THE INVENTION

The present invention provides a computer implemented method, and computer program product for placing objects. A global placer receives a plurality of regions, each region occupying a sub-area of a design area. receives a plurality of movebound objects, each movebound object associated with a region. The global placer receives a plurality of unconstrained objects, each unconstrained object associated with no region. The global placer receives a tolerance, wherein the placement tolerance defines a coronal fringe to at least one region. The global placer initially placing the plurality of movebound objects and unconstrained objects. The global placer iterates over objects without preference to region-affiliation to select an object, wherein the objects are comprised of the plurality of movebound objects and plurality of unconstrained objects. The global placer determines whether movebound object is within the tolerance of a region associated with the movebound object.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 1 is a block diagram of a data processing system in accordance with an illustrative embodiment of the invention;

DETAILED DESCRIPTION OF THE PREFERRED EMBODIMENT

Figure 2A:
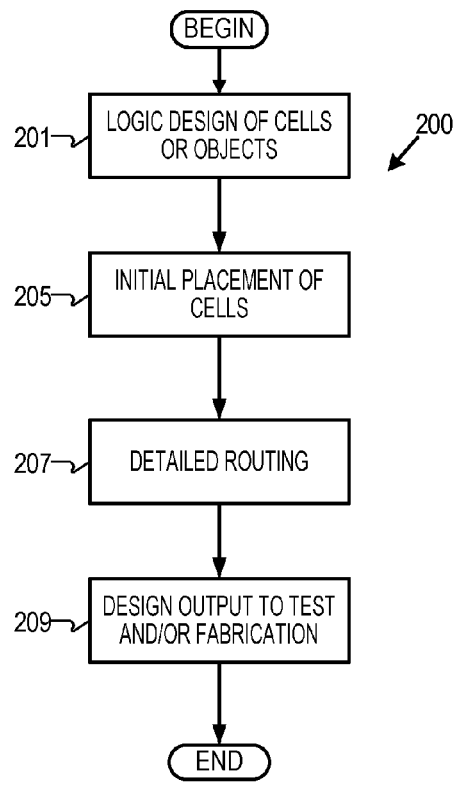
FIG. 2A is a flowchart of the general steps performed during electronic design automation in accordance with an illustrative embodiment of the invention.

With reference now to the figures and in particular with reference to FIG. 1, a block diagram of a data processing system is shown in which aspects of an illustrative embodiment may be implemented. Data processing system 100 is an example of a computer, in which code or instructions implementing the processes of the present invention may be located. In the depicted example, data processing system 100 employs a hub architecture including a north bridge and memory controller hub (NB/MCH) 102 and a south bridge and input/output (I/O) controller hub (SB/ICH) 104. Processor 106, main memory 108, and graphics processor 110 connect to north bridge and memory controller hub 102. Graphics processor 110 may connect to the NB/MCH through an accelerated graphics port (AGP), for example.

In the depicted example, local area network (LAN) adapter 112 connects to south bridge and I/O controller hub 104 and audio adapter 116, keyboard and mouse adapter 120, modem 122, read only memory (ROM) 124, hard disk drive (HDD) 126, CD-ROM drive 130, universal serial bus (USB) ports and other communications ports 132, and PCI/PCIe devices 134 connect to south bridge and I/O controller hub 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash binary input/output system (BIOS). Hard disk drive 126 and CD-ROM drive 130 may use, for example, an integrated drive electronics (IDE) or serial advanced technology attachment (SATA) interface. A super I/O (SIO) device 136 may be connected to south bridge and I/O controller hub 104.

An operating system runs on processor 106, and coordinates and provides control of various components within data processing system 100 in FIG. 1. The operating system may be a commercially available operating system such as Microsoft® Windows® XP. Microsoft and Windows are trademarks of Microsoft Corporation in the United States, other countries, or both. An object oriented programming system, such as the Java™ programming system, may run in conjunction with the operating system and provides calls to the operating system from Java™ programs or applications executing on data processing system 100. Java™ is a trademark of Oracle Corporation, Inc. in the United States, other countries, or both.

Instructions for the operating system, the object-oriented programming system, and applications or programs are located on storage devices, such as hard disk drive 126, and may be loaded into main memory 108 for execution by processor 106. The processes of the present invention can be performed by processor 106 using computer implemented instructions, which may be located in a memory such as, for example, main memory 108, read only memory 124, or in one or more peripheral devices.

Those of ordinary skill in the art will appreciate that the hardware in FIG. 1 may vary depending on the implementation. Other internal hardware or peripheral devices, such as flash memory, equivalent non-volatile memory, and the like, may be used in addition to or in place of the hardware depicted in FIG. 1. In addition, the processes of the illustrative embodiments may be applied to a multiprocessor data processing system.

In some illustrative examples, data processing system 100 may be a personal digital assistant (PDA), which is configured with flash memory to provide non-volatile memory for storing operating system files and/or user-generated data. A bus system may be comprised of one or more buses, such as a system bus, an I/O bus, and a PCI bus. Of course, the bus system may be implemented using any type of communications fabric or architecture that provides for a transfer of data between different components or devices attached to the fabric or architecture. A communication unit may include one or more devices used to transmit and receive data, such as a modem or a network adapter. A memory may be, for example, main memory 108 or a cache such as found in north bridge and memory controller hub 102. A processing unit may include one or more processors or CPUs. The depicted example in FIG. 1 is not meant to imply architectural limitations. For example, data processing system 100 also may be a tablet computer, laptop computer, or telephone device in addition to taking the form of a PDA.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable storage device(s) having computer readable program code embodied thereon.

Any combination of one or more computer readable storage device(s) may be utilized. A computer readable storage device may be, for example, but not limited to, an electronic, magnetic, optical, electromagnetic, or semiconductor system, apparatus, or device, or any suitable combination of the foregoing. More specific examples (a non-exhaustive list) of the computer readable storage device would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage device may be any tangible device that can store a program for use by or in connection with an instruction execution system, apparatus, or device. The term "computer-readable storage device" does not encompass a signal propagation media such as a copper cable, optical fiber or wireless transmission media.

Computer program code for carrying out operations for aspects of the present invention may be written in any combination of one or more programming languages, including an object oriented programming language such as Java™, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The illustrative embodiments permit a circuit designer to assign movebound objects to a region in a manner that permits a global placer to iteratively refine placement of the movebound object with a bias toward that region. However, once the movebound object is within the region, any such bias toward the region may be negated. Accordingly, such a movebound object, once placed inside the region, may be allowed to be placed in successive placements, to any part of the region. In addition, freedom to place the object within a coronal fringe of the region may be considered a satisfactory end position for a movebound object, thereby satisfying any design criteria that is relaxed with respect to a movebound object or region, at least within an allowable tolerance.

FIG. 2A is a flowchart of the general steps performed during electronic design automation in accordance with an illustrative embodiment of the invention. Process 200 may begin by designer operating a computer to develop a logic design for cells or objects. A cell or object is a design for a circuit for implementation in a semiconductor die. A library cell is an object that is a specification of a logic gate or other circuit used to process digital signals by defining, for example, pins, and transistor couplings between pins. The library cell may specify parameters, including, for example, a number of input pins, a number of output pins, a minimum allowable distance between pins, and the like. A parameter may include the relative Cartesian coordinates between pins, as well as the contours of each pin. From the parameters, further information concerning the pins can be derived, including the area of each pin.

Initially, the designer designs the cells or objects (step 201). Step 201 may rely on a data processing system such as described at 100 in FIG. 1 to determine completeness of the logic, as well as to aggregate cells into collectives of circuits that achieve higher levels of performance with each combination. Next, the electronic design automation (EDA) process may include initial placement of cells (step 205). This step 205 is the step that is more completely described in the detailed description below.

Following completion of initial placement, an algorithm may be operated as an instance of executing code on the data processing system to perform detailed routing (step 207). Detailed routing includes describing wire traces that a targeted technology can produce on the scale of the die. Such routing produces a specification of conductors to link all pins in the cells of the logic design by relying on the layers of conductors that a die fabrication is budgeted to create.

Finally, an integrated circuit may be produced in a final step. Such an integrated circuit may be suitable for packaging and/or placement within a circuit board. Accordingly, the EDA process may output a resultant design to a testing process or to fabrication (step 209).

Figure 2B:
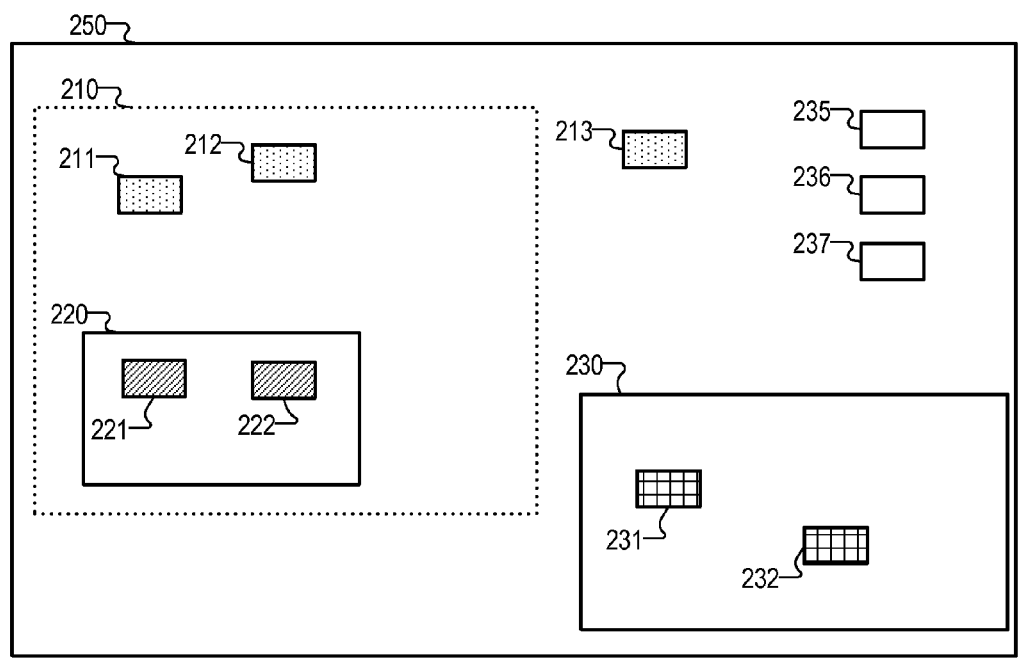
FIG. 2B depicts objects in a die and applicable regions in accordance with an illustrative embodiment of the invention.

FIG. 2B depicts objects in a die and applicable regions in accordance with an illustrative embodiment of the invention. FIG. 2B may be an intermediate step during iterations of placing objects within a die, and specifically, within design area 250. A design area is a surface of a silicon die that is to be used for placement of cells and conductors while performing steps of electronic design automation. Design area 250 may be a crystalline silicon, silicon-germanium, or other suitable substrate. Upon fabrication on an instance of physical semiconductor substrate, design area 250 may be implemented as polysilicon, p-type regions, n-type regions and metal, as well as unmodified substrate. Where necessary, vias and other interconnect structures may be created in the physical die.

Objects may receive tentative placements on design area 250. Each object may have a region-affiliation. Region-affiliation is a property of an object that may be binary—set to being either a) affiliated with one or more regions; and b) not affiliated with one or more regions (or geometrically limited features). Accordingly, an object among a set of objects may be either a movebound object or an unconstrained object, respectively, for an object affiliated with one or more regions, and an object not affiliated with one or more regions.

A region is a sub-area of a design area for which a designer or other director of the EDA processes identifies for preferential placement of at least one cell. For example, region 210 may be associated with movebound objects 211, 212, and 213. A movebound object is a cell or object that, in addition to design features of interconnection to one or more cells, is constrained to be placed within a tolerance of a region (geometrically limited feature), or within the region.

An unconstrained object is a cell or object, which is subject only to design rules or 'netlist' interconnection to additional cells during the electronic design automation process. In contrast with the movebound object, the unconstrained object is associated with no region or feature. Objects 235, 236 and 237 may have a region-affiliated bit described in their EDA data structure that indicates that such objects are not affiliated with a region. Accordingly, these objects are unconstrained objects. A netlist is a list of pins of objects that are connected by a common conductor within the design. To fabricate the design, a geometry of the connecting conductor is required, as well as the locations of the pins. In embodiments of the present invention, the netlist can include attraction nets, explained below.

Further, movebound objects 221 and 222 are associated to region 220. Similarly, movebound objects 231 and 232 are associated to region 230. Although regions are identified as rectangular, it is appreciated that other region shapes are within the scope of the embodiments, for example, 'L'-shaped, hexagonal, circular. In each case, the region has a perimeter. A perimeter is a line or arc that defines a border of the region. For example in FIG. 3, region 301 has perimeter 303. Region 321 has perimeter 330.

Figure 3:
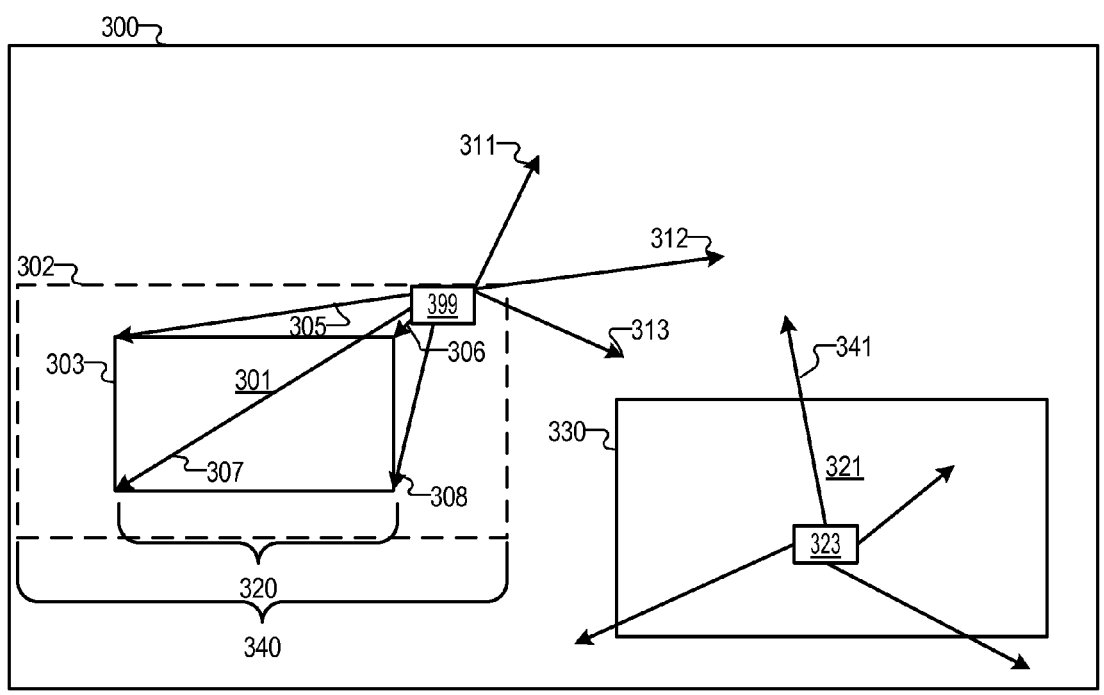
FIG. 3 depicts objects influenced by nets including attraction nets at an intermediate location in accordance with an illustrative embodiment of the invention.

FIG. 3 depicts objects influenced by nets including attraction nets at an intermediate location in accordance with an illustrative embodiment of the invention. Object 399 is a movebound object that is associated with region 301. Similarly, object 323 is a movebound object that is associated with region 321. In each case, the movebound objects can be repeatedly moved by the placement algorithm to reduce wire length, while obeying design rules, according to a weight placed on wire length extending to coordinates. A weight is a factor assigned to an attraction net that can differ from a factor applied to a real net in the netlist whereby the factors affect the wire length calculation. The real net portion of the netlist may be weighted, for example, 10, while the attraction net portion may be weighted a lesser value. A real net is a network of pins to which the object will be connected following routing and fabrication process steps. A wire length is the calculated length of a conductor that may be placed in a design area to connect at least two pins. The wire length can include additional lengths of conductor placement used to connect to a coordinate that forms a part of an attraction net. In addition, a wire length can be the number calculated when varying weights or factors are placed on a proposed conductor, whether to a pin or to an attraction net. In other words, the placement algorithm can use an objective function to minimize a Cartesian route of wires, as modified by wire length calculations, extending from the object to all coordinates that form an attraction net, as well as to the pins in the netlist of the object.

A netlist, in the illustrative embodiments, is made up of two components. The netlist has a real net component, and an attraction net component. An attraction net is the one or more pins that are simulated as targets for conductor interconnect in a netlist, but which are not coordinates that will be used in the actual routing of conductors. In other words, the attraction net includes an additional bias to connect a pin in the direction of the coordinates that are not part of the real net of an object. The additional bias is developed since the attraction net can contribute to overall wire length when wire lengths are calculated for various trial positions of the objects in the design area. Unlike the faked two-pin net in the Brasen prior art, an attraction net includes coordinates that are targets for applying a wire length minimization function, where the coordinates are located at the perimeter of the region to which the affected object is being placed in relation thereto. The attraction net can be a subset of coordinates on the perimeter of the region. In some cases the attraction net is at least three coordinates corresponding to the perimeter of the region. In some cases the attraction net is at least four coordinates corresponding to the perimeter of the region. In some cases the attraction net is fewer than five coordinates corresponding to the perimeter of the region. More specifically, the attraction net can be the coordinates corresponding to corners of the region.

An attraction net may be defined by using Cartesian coordinates. Alternatively, he attraction net may be defined by using other than Cartesian coordinates, such that axes of coordinates by which the attraction net is defined are non-orthogonal, but remain in a plane.

A weight corresponding an attraction net is a weight or factor that a designer may place on each coordinate in order to more strongly bias the placement of the object into a region. Once an object is placed within a region the weights of the attraction nets can be adaptively nullified so as to allow the object to be influenced by real net connections for free movement to any part, if necessary, within the region.

Region 301 includes the dimensions, for example, height and width 320. Surrounding region 301 is coronal fringe 302 extending from boundary 303 of the perimeter of region 301. The coronal fringe is an extension of the region. It can extend a tolerance extending outside the boundary of the region, provided the coronal fringe does not extend beyond the perimeter of the actual die or placement image 300.

A uniform proportion to a direction, is a distance along an axis of the design that extends a coronal fringe along the direction in proportion the dimension of the region along the same direction. A tolerance is an offset or coronal fringe that surrounds a region or other geometrically limited feature. The tolerance can be a uniform proportion in a first direction and a uniform proportion to the region in a second direction, wherein the second direction is orthogonal to the first direction. In the case of region 301, the coronal fringe extends to 25% of the width of region 301. In other words, coronal fringe width 340 is 25% larger than region width 320. Thus, in this case, the coronal fringe extends a uniform proportion in the direction of the width of the region. A uniform proportion to a direction, is a distance along an axis of the design that extends a coronal fringe along the direction in proportion the dimension of the region along the same direction.

Object 399 is inside the tolerance of region 301. An object is said to be inside the tolerance if it is within the coronal fringe of the region. If a coronal fringe is uniformly 0% larger than the region it is associated with, then the coronal fringe is the region. Conversely, an object is outside the tolerance if it is outside the coronal fringe.

Object's 399 placement may be influenced by an attraction net that includes coordinates on the periphery of boundary 303. Accordingly, each coordinate may be applied to influence iterative placement of the object 399, provided the object lies outside the region. Thus, in its depicted position, the placement algorithm is based on coordinates 305, 306, 307, 308, 311, 312, and 313.

In contrast, object 323 is within its associated region 321 and boundary 330. Accordingly, the influence of any coordinates at the boundary of region 321 may be negated. Thus, conventional placement may rely on, for example, a coordinate associated with a pin on a netlist, such as, for example, coordinate 341. The distinction of whether a movebound object is inside or outside its associated region is described below with reference to FIG. 5. Accordingly, the location of a movebound object relative to being inside or outside may influence flexibility of placing the movebound object.

Figures 4A, 4B, 4C:
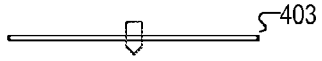
FIG. 4A is a user interface to a global placer in accordance with an illustrative embodiment of the invention.
FIG. 4B is a further user interface to enter borders for a region in accordance with an illustrative embodiment of the invention.
FIG. 4C is a user interface to identify movebound objects associated with a region in accordance with an illustrative embodiment of the invention.

FIG. 4A is a user interface to a global placer in accordance with an illustrative embodiment of the invention. User interface 400 is an optional interface presented to a circuit designer which permits the designer to select a tolerance of placement outside the region. In this case, the tolerance is associated with the region itself. The global placer may prompt a circuit designer to enter a tolerance from, for example, 0% to 25%. In this example, the circuit designer has adjusted slider input 403 control along a spectrum. Accordingly, in response to the circuit designer selecting 'continue' button 409, the global placer may set a tolerance to permit a coronal fringe of 25% of the applicable dimension size. The coordinate system applied can be, for example, a Cartesian coordinate system that identifies a die's opposing corners at coordinates (0,2) and (1000,3000).

FIG. 4B is a further user interface to enter borders for a region in accordance with an illustrative embodiment of the invention. The user interface may be dialog box 410. The circuit designer, may enter a first region coordinate to first region coordinate field 411, and a second region coordinate to a second region coordinate field 413. Each coordinate may be opposing corners to a rectangle according to a Cartesian coordinate system defining a design area. In addition, the circuit designer may enter, and the global placer correspondingly receive, a region name associated with the first region coordinate and the second region coordinate. Such an entry may be made to region field 415. A weight for an attraction net, explained further below, can also be entered at weight field 416. Continue button 417 can be used to confirm the circuit designer's entries.

FIG. 4C is a user interface to identify movebound objects associated with a region in accordance with an illustrative embodiment of the invention. Dialog box 420 may permit a circuit designer to associate objects to a region to form movebound objects. Initially, the circuit designer may identify the region in region field 421. For example, the circuit designer may reuse a region previously defined through the operation of a user interface such as dialog box 410 of FIG. 4B, above. Furthermore, the circuit designer may provide an object identifier to object field 423. The circuit designer may provide confirmation of association of object to region to form the movebound object by selecting either 'next object' button 425 or 'continue' button 427.

Figure 5:
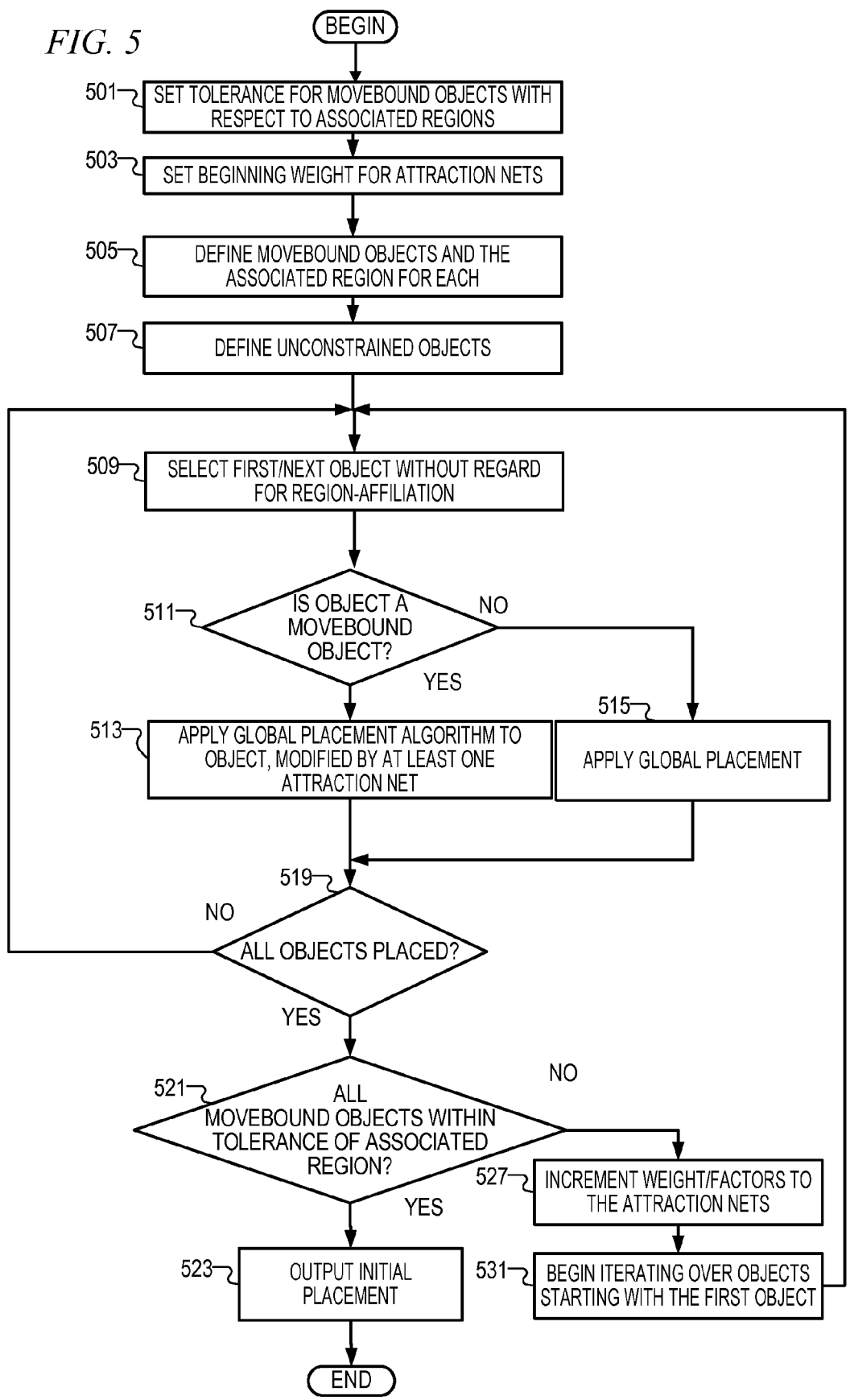
FIG. 5 is a flowchart of steps performed by global placer in accordance with an illustrative embodiment of the invention

FIG. 5 is a flowchart of steps performed by global placer in accordance with an illustrative embodiment of the invention. The global placer can receive all netlists or otherwise operate on the a file containing netlists. In particular, the netlist describes the interconnection among the objects in the design. Initially, the global placer may set a tolerance for movebound object with respect to associated regions (step 501). This step may be performed using the user interface 400 of FIG. 4A to set tolerances. Alternatively, the circuit designer may be prompted for tolerances applicable for each region in order to tailor tolerances on a region-by-region basis.

Next, the global placer may set a beginning weight for attraction nets (step 503). The weight of the attraction net portion of the net can be 1.5, while the weight of the real net can be 10. Next, the global placer may define movebound objects and the region to which each movebound object is associated (step 505). Next, the global placer may define unconstrained objects (step 507). Defining unconstrained objects may be accomplished by not assigning any region to such objects. In other words, a circuit designer can confirm an intention to complete the set of movebound objects. For example, the global placer may receive a user input at 'continue' button 427 of FIG. 4C. Such an input may be interpreted that the circuit designer is complete with selection of movebound objects, and that all remaining objects of the design are unconstrained objects.

It is appreciated that as an alternative to using dialog boxes and field inputs, a circuit designer may provide definitions, and the global placer may establish or define movebound and unconstrained objects on the basis of a file provided to the global placer. Such a file may be a comma separated value table, extensible markup language (XML) format or other formats that provide the same data as collected, alternatively, by dialog box. Further serialized formats may be within the scope of the invention.

In response to receiving a circuit designer's command to continue, the global placer may enter an iterative phase of placing objects. Accordingly, the global placer may select a first or next object without regard or preference for region-affiliation (step 509). In other words, the objects may be selected in any order, for example, a random order, that selects unconstrained objects and movebound objects. As such, the order for selecting the next object may be such that an unconstrained object is selected after a movebound object and is selected prior to another movebound object being selected. Accordingly, the movebound objects are intermingled in their order with unconstrained objects as the global placer executes steps 509 through 531. Such an order may be obtained by randomizing the unconstrained objects and the movebound objects as to the order of selection. Steps 511-521 and 527-531, below, may be repeated based on the object currently selected at step 509.

Next, the global placer may determine if the current object is a movebound object (step 511). The global placer may refer to a data structure formed in response to circuit designer inputs at steps 505 and 507. The outcome of step 511 determines which kind of secondary placement is performed on the object. Each object can be secondarily placed one or more times, depending on, for example, whether all movebound objects are later determined to satisfy tolerances associated with their associated regions.

A positive result at step 511 may cause the global placer to apply a global placement algorithm to the object, modified by at least one attraction net (step 513).

Step 513 occurs by placing the object based on associated netlist of the object and conditional application of attraction nets of the object and weights corresponding to each attraction net. The attraction nets are applied on the condition that the object is outside the region with which is associated. In other words, wire lengths attributable to the perimeter of the region do not contribute to the wire length calculation when the movebound object is placed within the associated region. Conversely, when the movebound object is outside the associated region, the objective function of minimizing wire length accounts for the weighted lengths of wire to two or more coordinates at the perimeter of the region. Put another way, the global placer may use an attraction net in response to the movebound object being outside the region associated with the movebound object—and not use the attraction net in response to the movebound object being inside the region associated with the movebound object.

On the other hand, if the result of step 511 is negative, the global placer applies a conventional global placement algorithm minimizing wire length in the netlist of the object. In other words, the distinction between conventional global placement algorithm at step 515, and the algorithm modified by the at least one attraction net (step 513) is that the attraction nets algorithm is only applied to movebound objects, and then, once the object is within its associated region, the attraction net term in the wire length calculation is negated/cancelled. Alternately, the weight on the attraction net can be nullified, so that it does not influence the placement of the object.

Following steps 513 and 515, the global placer determines whether all objects are placed (step 519). A negative determination causes the global placer to repeat step 509, thereby iterating over a next object. However, a positive determination may cause the global placer to determine if all movebound objects are within tolerance of the associated region (step 521). As explained above, tolerance can be within a coronal fringe of the region. If all movebound objects meet the tolerance, then the global placer may output initial placement (step 523). Output can be to a file usable or readable to a subsequent stage in the EDA process. Such a stage can be, for example, detailed routing 207 of FIG. 2A. Processing may terminate thereafter.

On the other hand, if a movebound object remains outside the tolerance for its associated region, the global placer may increment weights associated with attraction nets of the movebound objects (step 527). In response to incrementing the weights, the global placer may begin iterating over objects starting with the first object (step 531). Each time an attraction net is used, there will be a corresponding incremented weight applied that may bring the object closer to or within the region when using the global placement algorithm, at least as compared to a previous iteration through the objects. An incremented weight is a weight or factor used to bias the objective function in an increased manner as compared to a previous weight assigned the attraction net. Processing resumes, thereafter, at step 509.

Accordingly, a circuit designer may elect to use a strict region association between a movebound object and a corresponding region, whereby, the global placer secondarily places all objects in response to at least one movebound object being outside of its region. In other words, such an election occurs when the circuit designer enters a 0% tolerance for the regions in the design area. In contrast, the designer can elect a more relaxed criteria by setting a tolerance other than 0. Such a strategy can be employed when computing resources of the EDA process are limited such that insufficient time is available for protracted iterations through the global placement, as compared with strict region association. In addition, illustrative embodiments may allow biases by attraction nets to place objects in a concentrated sub-region of a region when secondary placement is from a location outside the associated region. However, in response to being within a region, the movebound object can be placed without influence of the attraction nets.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable device providing program code for use by or in connection with a computer or any instruction execution system. For the purposes of this description, a computer-usable or computer readable device can be any tangible apparatus that can store the program for use by or in connection with the instruction execution system, apparatus, or device.

A data processing system suitable for storing and/or executing program code will include at least one processor coupled directly or indirectly to memory elements through a system bus. The memory elements can include local memory employed during actual execution of the program code, bulk storage, and cache memories, which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for placing objects, the method comprising:
a computer receiving a plurality of regions, each region occupying a sub-area of a design area;
the computer receiving a plurality of movebound objects, each movebound object associated with a region;
the computer receiving a plurality of unconstrained objects, each unconstrained object associated with no region;
the computer receiving a tolerance, wherein the tolerance defines a coronal fringe to each region, which is used to limit the placement of at least one movebound object associated with each region;
the computer initially placing the plurality of movebound objects and unconstrained objects;
the computer iterating over objects without preference to region-affiliation to select an object, wherein the objects are comprised of the plurality of movebound objects and plurality of unconstrained objects;
the computer determining whether a selected object is a movebound object;
responsive to a determination that the selected object is a movebound object, the computer first placing the movebound object based on a netlist of the movebound object and conditional application of attraction nets of the movebound object and weights corresponding to each attraction net;
and in response, the computer first determining whether each of the plurality of the movebound objects is within the coronal fringe of a region associated with the movebound object; and in response to an movebound object being outside a coronal fringe of the associated region, second placing each of the plurality of movebound objects;
second determining whether each of the plurality of movebound objects is within the coronal fringe of the corresponding region, and
the computer concluding placement of the plurality movebound objects and plurality of unconstrained objects in response to the movebound object being within the coronal fringe of the region associated with the movebound object.

2. The method of claim 1, wherein conditional application of attraction nets comprises using an attraction net in response to the movebound object being outside the region associated with the movebound object; and not using the attraction net in response to the movebound object being inside the region associated with the movebound object.

3. The method of claim 2, wherein the tolerance is a uniform proportion in a first direction and a uniform proportion to the region in a second direction.

4. The method of claim 2, wherein the attraction net comprises at least four coordinates corresponding to the perimeter of the region.

5. The method of claim 4, wherein the attraction net is at least the four coordinates corresponding to corners of the region.

6. The method of claim 1, further comprising:
responsive to the determination that any movebound object is outside the coronal fringe of the region, incrementing weights corresponding to each attraction net of each movebound object to form incremented weights; and
wherein second placing each of the plurality of movebound objects is based on a netlist of the movebound object, attraction nets of the movebound object and incremented weights corresponding to each attraction net.

7. The method of claim 2, wherein first placing is according to an objective function, wherein the objective function is minimizing wire length of nets in a netlist.

8. A computer program product for placing objects, the computer program product comprising:
a computer readable tangible storage device having computer readable program code embodied therewith, the computer readable program code comprising:
computer readable program code configured to receive a plurality of regions, each region occupying a sub-area of a design area;
computer readable program code configured to receive a plurality of movebound objects, each movebound object associated with a region;
computer readable program code configured to receive a plurality of unconstrained objects, each unconstrained object associated with no region;
computer readable program code configured to receive a tolerance, wherein the tolerance defines a coronal fringe to each region, which is used to limit the placement of at least one movebound object associated with each region;
computer readable program code configured to initially placing the plurality of movebound objects and unconstrained objects;
computer readable program code configured to iterate over objects without preference to region-affiliation to select an object, wherein the objects are comprised of the plurality of movebound objects and plurality of unconstrained objects;
computer readable program code configured to determine whether a selected object is a movebound object;
computer readable program code configured to first place the movebound object based on a netlist of the movebound object and conditional application of attraction nets of the movebound object and weights corresponding to each attraction net, responsive to a determination that the selected object is a movebound object;
computer readable program code configured to and in response, first determine whether each of the plurality of the movebound objects is within the coronal fringe of a region associated with the movebound object; and in response to any movebound object being outside a coronal fringe of the associated region, second place each of the plurality of movebound objects;
computer readable program code configured to second determine whether each of the plurality of movebound objects is within the coronal fringe of the corresponding region, and
computer readable program code configured to conclude placement of the plurality movebound objects and plurality of unconstrained objects in response to the all movebound objects being within its respective corresponding coronal fringe.

9. The computer program product of claim 8, wherein conditional application of attraction nets comprises using an attraction net in response to the movebound object being outside the region associated with the movebound object; and not using the attraction net in response to the movebound object being inside the region associated with the movebound object.

10. The computer program product of claim 9, wherein the tolerance is a uniform proportion in a first direction and a uniform proportion to the region in a second direction, wherein the second direction is orthogonal to the first direction.

11. The computer program product of claim 9, wherein the attraction net comprises at least four coordinates corresponding to the perimeter of the region.

12. The computer program product of claim 11, wherein the attraction net is at least the four coordinates corresponding to corners of the region.

13. The computer program product of claim 8, a further comprising:
computer readable program code configured to increment weights corresponding to each attraction net of each movebound object to form incremented weights, responsive to the determination that any movebound object is outside the coronal fringe tolerance of the region; and
wherein second placing each of the plurality of movebound objects is based on a netlist of the movebound object, attraction nets of the movebound object and incremented weights corresponding to each attraction net.

14. The computer program product of claim 9, wherein computer readable program code to first place is according to an objective function, wherein the objective function is minimizing wire length of nets in a netlist.

15. A computer system for placing objects, the computer system comprising: a processor, a computer readable memory and a computer readable tangible storage device;
first program instructions to receive a plurality of regions, each region occupying a sub-area of a design area;
second program instructions to receive a plurality of movebound objects, each movebound object associated with a region;
third program instructions to receive a plurality of unconstrained objects, each unconstrained object associated with no region;
fourth program instructions to receive a tolerance, wherein the tolerance defines a coronal fringe to each region, which is used to limit the placement of at least one movebound object associated with each region;
fifth program instructions to initially place the plurality of movebound objects and unconstrained objects;
sixth program instructions to iterate over objects without preference to region-affiliation to select an object, wherein the objects are comprised of the plurality of movebound objects and plurality of unconstrained objects;
seventh program instructions to determine whether a selected object is a movebound object;
eighth program instructions to first place the movebound object based on a netlist of the movebound object and conditional application of attraction nets of the movebound object and weights corresponding to each attraction net, responsive to a determination that the selected object is a movebound object, and in response first ninth program instructions to determine whether each of the plurality of the movebound objects is within the coronal fringe of a region associated with the movebound object; and in response to any movebound object being outside a coronal fringe of the associated region, second place each of the plurality of movebound objects;

tenth program instructions to second place each of the plurality of movebound objects, in response to any movebound object being outside a coronal fringe of the associated region, and eleventh program instructions to conclude placement of the plurality movebound objects and plurality of unconstrained objects in response to all the movebound objects being within its respective corresponding coronal fringe of the region; and wherein the first, second, third, fourth, fifth, sixth, seventh, eighth, ninth, tenth and eleventh program instructions are stored on the computer readable tangible storage device for execution by the processor via the computer readable memory.

16. The computer system of claim 15, wherein conditional application of attraction nets comprises using an attraction net in response to the movebound object being outside the region associated with the movebound object not using the attraction net in response to the movebound object being inside the region associated with the movebound object.

17. The computer system of claim 16, wherein the tolerance is a uniform proportion in a first direction and a uniform proportion to the region in a second direction, wherein the second direction is orthogonal to the first direction.

18. The computer system of claim 16, wherein the attraction net comprises at least four coordinates corresponding to the perimeter of the region.

19. The computer system of claim 18, wherein the attraction net is at least the four coordinates corresponding to corners of the region.

20. The computer system of claim 15, further comprising:
twelfth program instructions to increment weights corresponding to each attraction net of each movebound object to form incremented weights, responsive to the determination that any movebound object is outside the coronal fringe of the region; and wherein second placing each of the plurality of movebound objects is based on a netlist of the movebound object, attraction nets of the movebound object and incremented weights corresponding to each attraction net; and wherein the twelfth, and thirteenth program instructions are stored on the computer readable tangible storage device for execution by the processor via the computer readable memory.

21. A method for placing objects, the method comprising:
a computer receiving a plurality of regions, each region occupying a sub-area of a design area;
the computer receiving a plurality of movebound objects and plurality of unconstrained objects, wherein each movebound object is constrained to be placed within a tolerance of a region, and each unconstrained object is not constrained to be placed within a tolerance of a region;
the computer receiving the tolerance, wherein the tolerance defines a coronal fringe to at least one region, which is used to limit the placement of at least one movebound object associated with each region;
the computer initially placing the plurality of movebound objects and unconstrained objects;
the computer iterating over movebound objects and unconstrained objects without preference to region-affiliation to select an object, wherein the objects are comprised of the plurality of movebound objects and plurality of unconstrained objects;
the computer determining whether a selected object is a movebound object;
responsive to a determination that the selected object is a movebound object, the computer first placing the movebound object based on a netlist of the movebound object and conditional application of attraction nets of the movebound object and weights corresponding to each attraction net, wherein conditional application further comprises;
the computer determining that the movebound object is outside a region with which the movebound object is associated, and
not using the attraction net of the movebound object in response to the determination that the movebound object is outside the region;
the computer determining whether the movebound object is within the coronal fringe of the region associated with the movebound object; and
in response to all movebound objects being within the coronal fringe of the region associated with the movebound object, the computer concluding placement;
responsive to first placing the movebound object, the computer determining that the movebound object is outside the coronal fringe of the region;
responsive to the determination, the computer incrementing weights corresponding to each attraction net to form incremented weights; and
the computer second placing the movebound object based on netlist of the movebound object, attraction nets of the movebound object and incremented weights corresponding to each attraction net.

22. The method of claim 21, wherein the attraction net comprises at least one pin simulated as targets for conductor interconnect in a netlist of a movebound object, wherein the at least one pin is not co-extensive with coordinates to be used in routing of conductors.

23. The method of claim 22, wherein the attraction net comprises a subset of coordinates on the perimeter of the region.

24. The method of claim 23, wherein the attraction net comprises fewer than five coordinates corresponding to the perimeter of the region.

25. The method of claim 24, wherein the attraction net is defined using other than Cartesian coordinates, such that axes of coordinates by which the attraction net is defined are non-orthogonal.

* * * * *